US007427751B2

(12) United States Patent
Geist et al.

(10) Patent No.: US 7,427,751 B2
(45) Date of Patent: Sep. 23, 2008

(54) HIGH SENSITIVITY SLITLESS ION SOURCE MASS SPECTROMETER FOR TRACE GAS LEAK DETECTION

(75) Inventors: J. Daniel Geist, Boxborough, MA (US); Jeffrey Diep, Quincy, MA (US); Peter Williams, Phoenix, AZ (US); Charles W. Perkins, Boston, MA (US)

(73) Assignee: Varian, Inc., Palo Alto, CA (US)

( * ) Notice: Subject to any disclaimer, the term of this patent is extended or adjusted under 35 U.S.C. 154(b) by 285 days.

(21) Appl. No.: 11/354,737

(22) Filed: Feb. 15, 2006

(65) Prior Publication Data

US 2007/0187592 A1    Aug. 16, 2007

(51) Int. Cl.
*B01D 59/44*    (2006.01)

(52) U.S. Cl. .................. 250/298; 250/281; 250/285; 250/299

(58) Field of Classification Search ........... 250/298
See application file for complete search history.

(56) References Cited

U.S. PATENT DOCUMENTS

| | | | |
|---|---|---|---|
| 3,277,295 A | 10/1966 | Briggs | |
| 3,520,176 A | 7/1970 | Becker | |
| 3,591,827 A | 7/1971 | Hall | |
| 3,690,151 A | 9/1972 | Briggs | |
| 4,155,008 A * | 5/1979 | Janes et al. ............... | 250/281 |
| 4,499,752 A | 2/1985 | Fruzzetti et al. | |
| 4,735,084 A | 4/1988 | Fruzzetti | |
| 4,761,553 A * | 8/1988 | Juravic, Jr. ............... | 250/298 |
| 4,773,256 A | 9/1988 | Saulgeot | |
| 4,845,360 A | 7/1989 | Landfors | |
| 4,943,718 A * | 7/1990 | Haines et al. ............. | 250/288 |
| 5,313,061 A * | 5/1994 | Drew et al. ............... | 250/281 |
| 5,352,893 A * | 10/1994 | Freedman ................. | 250/289 |
| 5,506,412 A | 4/1996 | Buttrill, Jr. | |
| 5,625,141 A | 4/1997 | Mahoney et al. | |
| 5,661,229 A | 8/1997 | Bohm et al. | |
| 5,728,929 A | 3/1998 | Gevaud | |
| 6,014,892 A | 1/2000 | Baret et al. | |
| 6,286,362 B1 | 9/2001 | Coffman et al. | |
| 6,541,781 B1 * | 4/2003 | Benveniste et al. ..... | 250/492.21 |

OTHER PUBLICATIONS

Article by Philip T. Smith entitled "The Ionization of Helium, Neon, and Argon by Electron Impact", published by Physical Review, vol. 36, Oct. 15, 1930, pp. 1293-1302.

* cited by examiner

*Primary Examiner*—Jack I. Berman
*Assistant Examiner*—Andrew Smyth
(74) *Attorney, Agent, or Firm*—Bella Fishman; William R. McClellan (57) ABSTRACT

A mass spectrometer includes a main magnet having spaced-apart polepieces which define a gap, the main magnet producing a magnetic field in the gap, an ion source to generate ions and to accelerate the ions into the magnetic field in the gap, the ion source located outside the gap, and an ion detector to detect a selected species of the ions generated by the ion source and deflected by the magnetic field. The ion detector is located in the gap at a natural focus point of the selected species of ions. The mass spectrometer may be used in a trace gas leak detector.

16 Claims, 6 Drawing Sheets

HIGH SENSITIVITY SLITLESS ION SOURCE MASS SPECTROMETER FOR TRACE GAS LEAK DETECTION

CROSS-REFERENCE TO RELATED APPLICATION

This application is related to the following co-pending U.S. patent application entitled "MASS SPECTROMETER FOR TRACE GAS LEAK DETECTION WITH SUPPRESSION OF UNDESIRED IONS", which is commonly assigned to the assignee of the present disclosure and is being filed concurrently with the present application on Feb. 15, 2006.

FIELD OF THE INVENTION

This invention relates to mass spectrometers that are used for leak detection applications and, more particularly, to mass spectrometers that have high sensitivity.

BACKGROUND OF THE INVENTION

Helium mass spectrometer leak detection is a well-known leak detection technique. Helium is used as a tracer gas which passes through the smallest of leaks in a sealed test piece. The helium is then drawn into a leak detection instrument and is measured. The quantity of helium corresponds to the leak rate. An important component of the instrument is a mass spectrometer which detects and measures the helium. The input gas is ionized and mass analyzed by the spectrometer in order to separate the helium component, which is then measured. In one approach, the interior of a test piece is coupled to the test port of the leak detector. Helium is sprayed on to the exterior of the test piece, is drawn inside through a leak and is measured by the leak detector.

Figure 1:
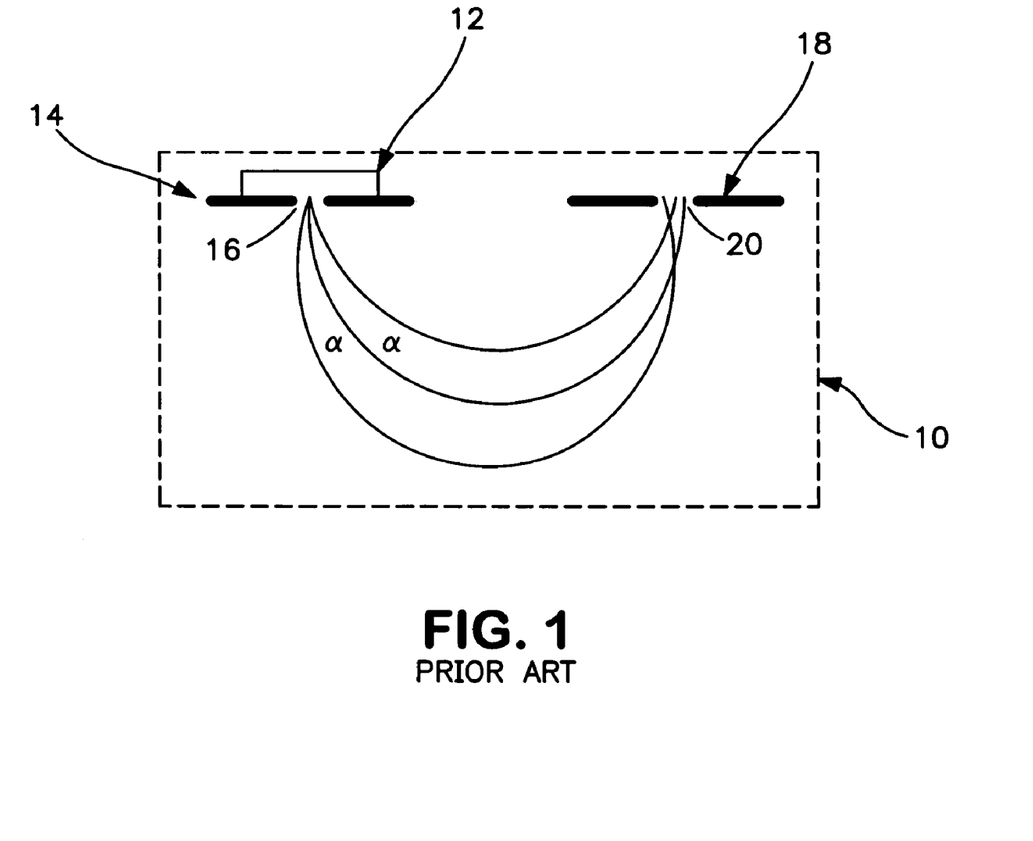
FIG. 1 is a simplified schematic diagram of a conventional mass spectrometer.

A schematic diagram of a conventional mass spectrometer is shown in FIG. 1. A dipole magnet 10 produces a magnetic field perpendicular to the plane of FIG. 1. An ion source 12 located between the polepieces of the dipole magnet 10 includes a plate 14 having an entrance slit 16. The ion sources in prior art spectrometers utilize a very small entrance slit of width $S_E$, typically 0.5 millimeter in width and several millimeters in length, to physically define an ion optical object. Ions diverging from this ion optical object are reconverged to an image after some deflection angle in the magnetic field. Bending angles of 90° and 180° are the most common. If the ions diverge from the entrance slit 16 with a half-angle α and travel in a uniform magnetic field on a circular trajectory with radius R, a 1:1 image of the entrance slit is formed after a 180° deflection. This image is broadened by an amount $R\alpha^2$ which results from the different trajectories in the magnetic field of ions diverging either side of the central trajectory, so that the overall image width is $S_E+R\alpha^2$. A plate 18 defining an exit slit 20 at the image position allows only ions of a given mass-to-charge ratio to pass through to a detector (not shown), which produces an ion current in response to sensed ions. Ions of different mass-to-charge ratio (m/z) travel on different radii and cannot pass through the exit slit 20.

The 180° deflection design has been considered convenient for an inexpensive mass-produced system because the focal positions are thought to be well known. A corresponding tradeoff, however, is the fact the entire ion source, including electron-generating filaments, must be placed inside the magnet gap. The length of the entrance slit is thus reduced by the space taken up by filaments and other ion source components to a fraction of the magnet gap, and the detected signal is thereby reduced. A more serious deficiency of the typical mass spectrometer design is that in simple designs without any ion-optical focusing elements between the ion source and the entrance slit, the entrance slit does not serve as an ideal ion optical object. Ions are formed in the ion source some distance back from the entrance slit and are accelerated toward the slit. The ion optical behavior of the ion source causes the ions to appear to diverge from a point near the source, so that the 180° focal point does not correspond to the position of the exit slit, if this slit is positioned at 180° from the entrance slit, but instead occurs some distance before the exit slit position. In this case, the ion beam broadens again before reaching the exit slit and the detected signal is further reduced or a larger exit slit is required, which reduces the mass resolving power. In such a case, the entrance slit actually functions as an angle-limiting slit.

The ion current in a helium mass spectrometer for very low leak rates is on the order femtoamps. With present state of the art leak detector spectrometer technology, this small signal is difficult to detect with sufficient stability to provide an unambiguous leak rate signal. In order to reach the high sensitivity required in modern leak detector applications, for example 1e-11 std-cc/sec or less, current leak detector spectrometers utilize some type of signal amplification, such as an electron multiplier. Electron multipliers are expensive and complicated components. They require a high voltage power supply, typically at 500 to 1800 volts, and frequent tuning is required. The gain of the electron multiplier decays from the time the unit is switched on. In addition, electron multipliers have a limited lifetime, after which they must be replaced at high cost to the user. Lifetime is particularly short, and gain drift is particularly noticeable, in the typically poor vacuum in which leak detectors usually operate.

Accordingly, there is a need for improved mass spectrometers and methods for trace gas leak detection.

SUMMARY OF THE INVENTION

According to a first aspect of the invention, a mass spectrometer comprises a main magnet including spaced-apart polepieces which define a gap, the main magnet producing a main magnetic field in the gap, an ion source to generate ions and to accelerate the ions into the main magnetic field in the gap, the ion source located outside the gap, and an ion detector to detect a selected species of the ions generated by the ion source and deflected by the main magnetic field. The ion detector is located in the gap at a natural focus point of the selected species of the ions.

The ion source may comprise an extractor electrode that defines an elongated extractor slit, a reference electrode that defines an elongated reference slit, at least one filament positioned adjacent to the extractor slit, and a repeller electrode spaced from the extractor electrode. Ionizing electrons generated by the filament are accelerated from the filament to an ionization region near the extractor slit for ionization of a gas, and ions generated in the ionization region are extracted through the extractor slit and are accelerated through the reference slit into the gap between the polepieces of the main magnet. The ion source may further include a source magnet including spaced-apart polepieces that produce a source magnetic field to constrain trajectories of the ionizing electrons.

According to a second aspect of the invention, a method is provided for detecting a trace gas. The method comprises generating a magnetic field in a gap between spaced-apart polepieces of a main magnet, ionizing the trace gas in an ion source located outside the gap, accelerating the trace gas ions into the gap between the polepieces of the main magnet so that the trace gas ions are deflected by the magnetic field in the gap, and detecting a selected species of the deflected trace gas ions with a detector located in the gap at a natural focus point of the selected species of the trace gas ions.

BRIEF DESCRIPTION OF THE DRAWINGS

For a better understanding of the present invention, reference is made to the accompanying drawings, which are incorporated herein by reference and in which.

DETAILED DESCRIPTION OF THE INVENTION

Figure 2:
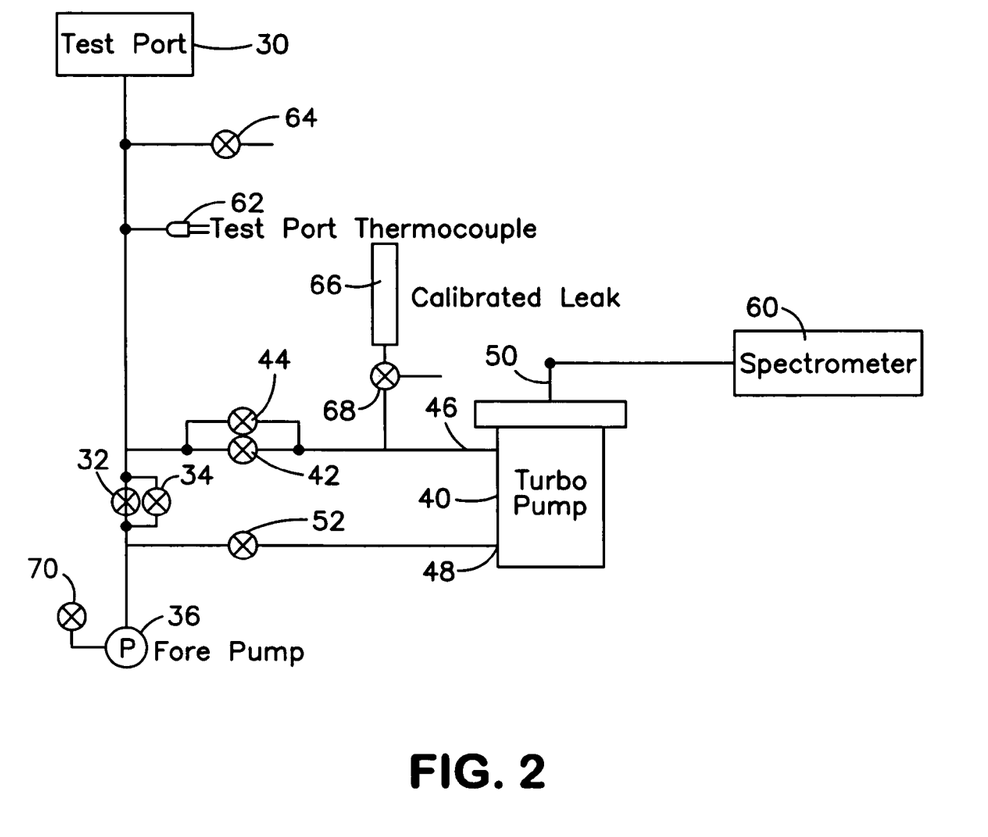
FIG. 2 is a schematic block diagram of a counterflow leak detector.

A leak detector suitable for implementation of embodiments of the invention is illustrated schematically in FIG. 2. A test port 30 is coupled through contraflow valves 32 and 34 to a forepump 36. The leak detector also includes a high vacuum pump 40. The test port 30 is coupled through midstage valves 42 and 44 to a midstage port 46 on high vacuum pump 40 located between a foreline 48 and an inlet 50 of high vacuum pump 40. A foreline valve 52 couples forepump 36 to the foreline 48 of high vacuum pump 40. The inlet 50 of high vacuum pump 40 is coupled to the inlet of a mass spectrometer 60. The leak detector further includes a test port thermocouple 62 and a vent valve 64, both coupled to test port 30, a calibrated leak 66 coupled through a calibrated leak valve 68 to midstage port 46 of high vacuum pump 40 and a ballast valve 70 coupled to forepump 36.

In operation, forepump 36 initially evacuates test port 30 and the test piece (or sniffer probe) by closing foreline valve 52 and vent valve 64 and opening contraflow valves 32 and 34. When the pressure at the test port 30 reaches a level compatible with the foreline pressure of high vacuum pump 40, foreline valve 52 is opened, exposing test port 30 to the foreline 48 of high vacuum pump 40. The helium tracer gas is drawn through test port 30 and diffuses in reverse direction through high vacuum pump 40 to mass spectrometer 60. Forepump 36 continues to lower the pressure in test port 30 to the point where the pressure is compatible with the midstage pressure in high vacuum pump 40. At that point, contraflow valves 32 and 34 are closed and midstage valves 42 and 44 are opened, exposing test port 30 to the midstage port 46 of high vacuum pump 40. The helium tracer gas is drawn through test port 30 and diffuses in reverse direction through the upper portion of high vacuum pump 40 to mass spectrometer 60, allowing more gas to diffuse because of the shorter reverse direction path. Since high vacuum pump 40 has a much lower reverse diffusion rate for heavier gases in the sample, it blocks these gases from mass spectrometer 60, thereby efficiently separating the tracer gas, which diffuses through high vacuum pump 40 to mass spectrometer 60 and is measured.

Figure 3:
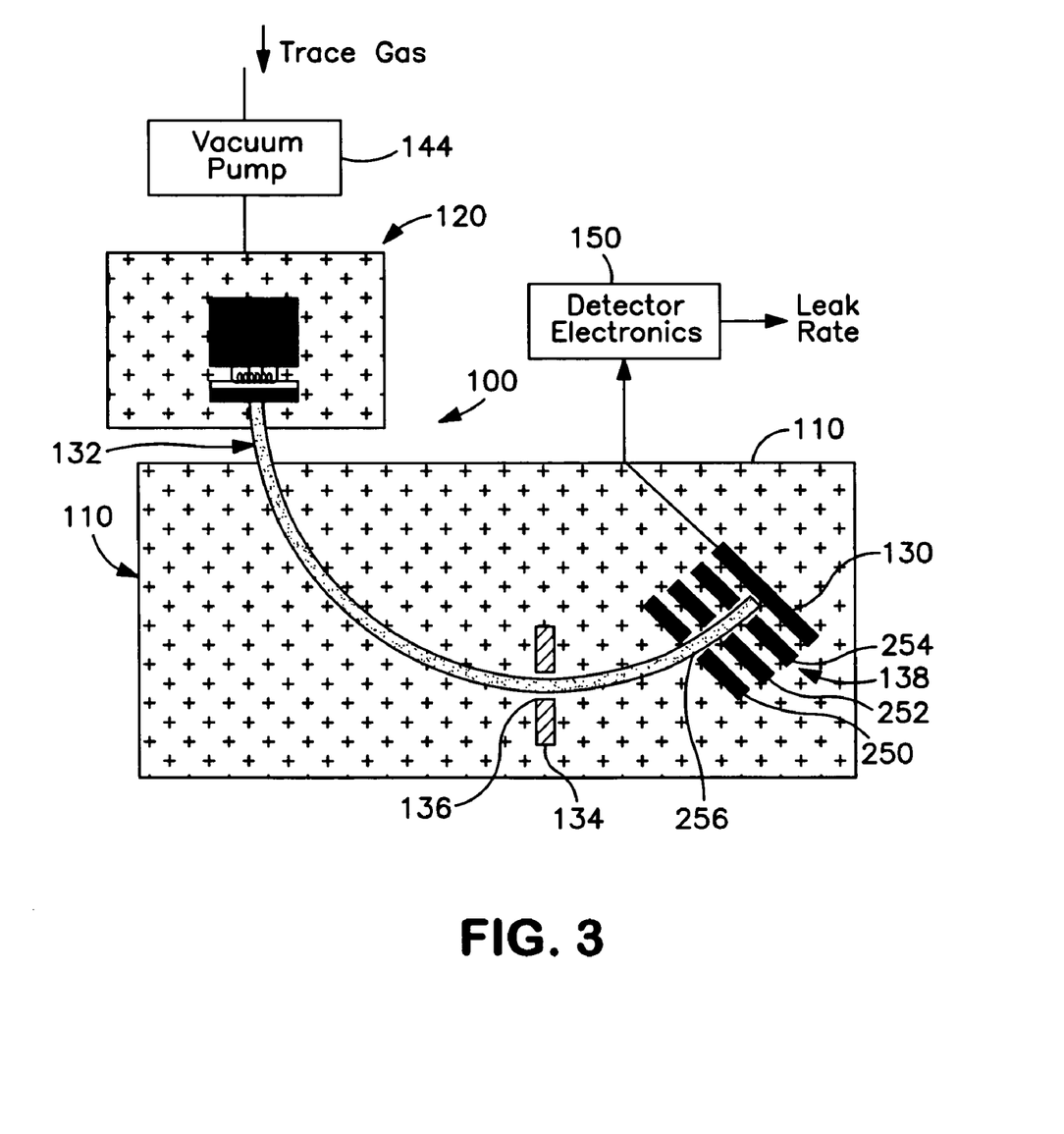
FIG. 3 is a simplified schematic side view of a mass spectrometer in accordance with an embodiment of the invention.
Figure 4:
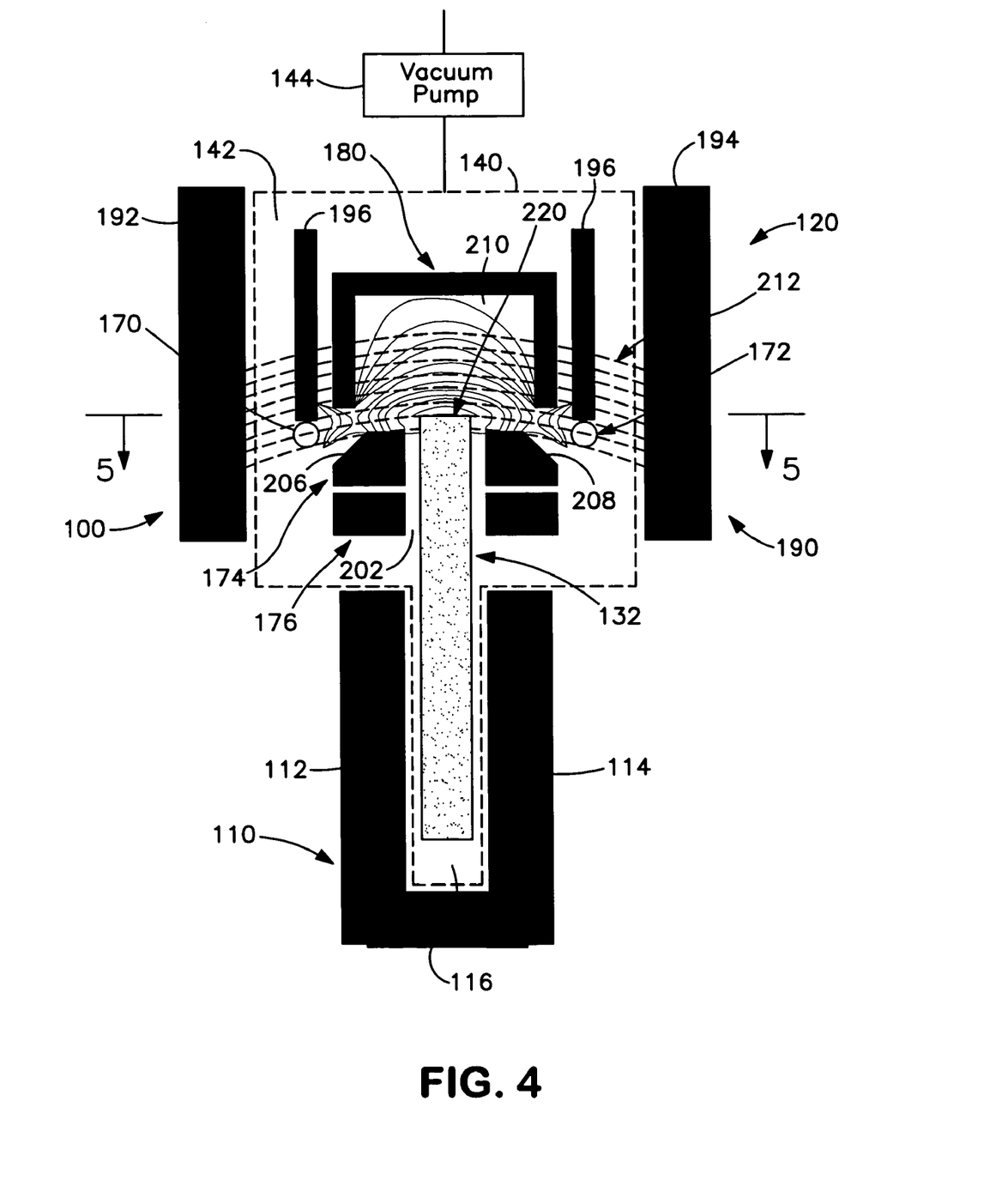
FIG. 4 is a simplified schematic end view of FIG. 3.
Figure 5:
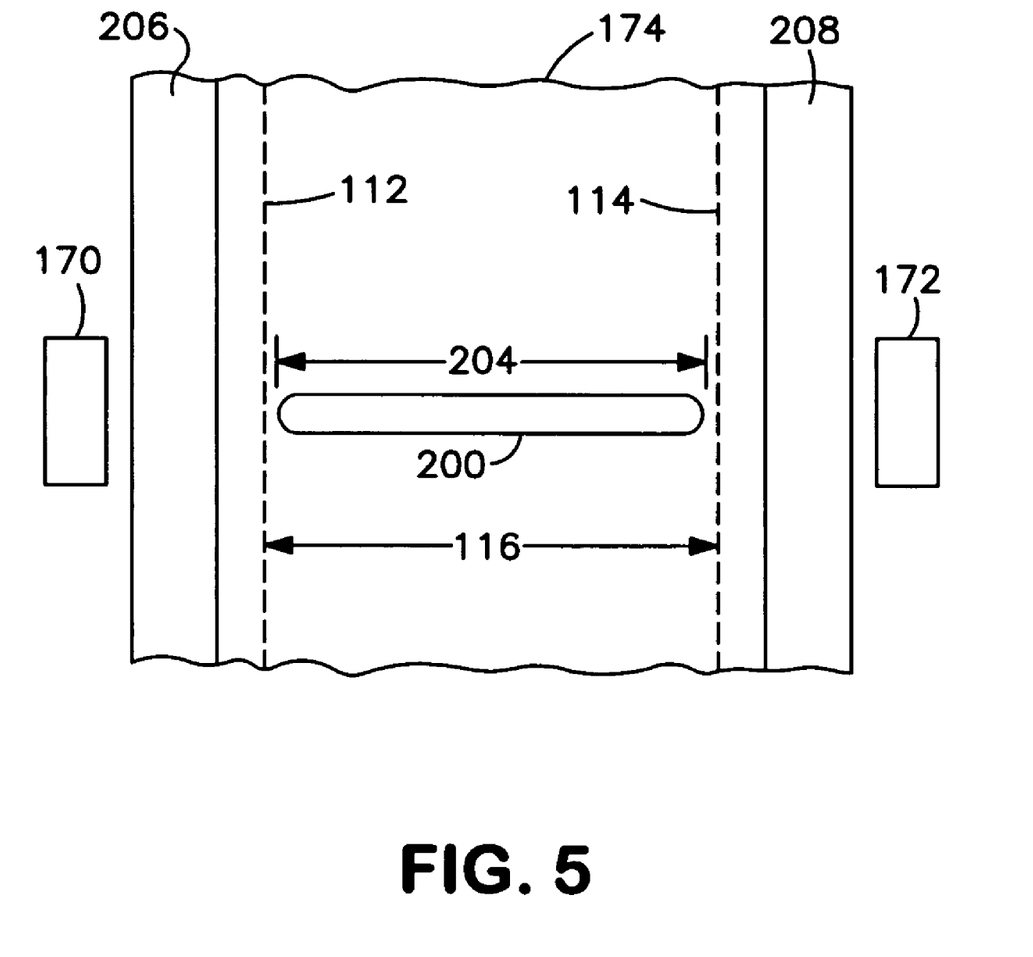
FIG. 5 is a partial cross-sectional view of the ion source, taken along the line 5-5 of FIG. 4.

A mass spectrometer 100 in accordance with an embodiment of the invention is shown in FIGS. 3-5. Mass spectrometer 100 corresponds to mass spectrometer 60 in FIG. 2. Mass spectrometer 100 includes a main magnet 110, typically a dipole magnet, an ion source 120 and an ion detector 130. Main magnet 110 includes spaced-apart polepieces 112 and 114 (FIG. 4), which define a gap 116. Ion source 120 is located outside gap 116 and thus is not located between polepieces 112 and 114. Ion detector 130 is positioned in gap 116 between polepieces 112 and 114 to intercept a selected species of the ions generated by ion source 120. Ions generated by ion source 120 enter gap 116 between polepieces 112 and 114 of main magnet 110 and are deflected by the magnetic field in gap 116. The deflection is a function of the mass-to-charge ratio of the ions, the ion energy and the magnetic field. Ions of the selected species, such as helium ions, follow an ion trajectory 132, while other ion species follow different trajectories. The ion detector 130 is located in gap 116 between polepieces 112 and 114 and is positioned at a natural focus of the selected ion species.

Mass spectrometer 100 may further include a collimator 134 having a slit 136 and ion optical lens 138. Collimator 134 permits ions following ion trajectory 132 to pass through slit 136 to ion detector 130 and blocks ions following other trajectories. Ion optical lens 138 is operated at a high positive potential near the ion source potential and acts to block scattered ions of species other than helium from reaching the ion detector. This action results from the fact that non-helium ions that have undergone scattering collisions, with neutral gas atoms or with the chamber walls, that change their trajectories sufficiently for them to reach slit 136, lose energy in those collisions and so are unable to overcome the potential energy barrier imposed by ion optical lens 138. Ion optical lens 138 also acts to focus ions following ion trajectory 132 onto ion detector 130.

A vacuum housing 140 encloses a vacuum chamber 142, including a portion of ion source 120 and gap 116 between polepieces 112 and 114 of main magnet 110. A vacuum pump 144 has an inlet connected to vacuum housing 140. Vacuum pump 144 maintains vacuum chamber 142 at a suitable pressure, typically on the order of $10^{-5}$ torr, for operation of mass spectrometer 100. Vacuum pump 144 is typically a turbomolecular vacuum pump, a diffusion pump or other molecular pump and corresponds to high vacuum pump 40 shown in FIG. 2. As known in the leak detector art, the trace gas, such as helium, diffuses in a reverse direction through all or a portion of the vacuum pump 144 to mass spectrometer 100 and is measured. This configuration is known as a contraflow leak detector configuration. In the contraflow configuration, heavier gases are pumped from vacuum chamber 142, while lighter gases diffuse in reverse direction through vacuum pump 144 to mass spectrometer 100. It will be understood that the present invention is not limited to use in contraflow leak detectors.

Ions following trajectory 132 are detected by ion detector 130 and converted to an electrical signal. The electrical signal is provided to detector electronics 150. Detector electronics 150 amplifies the ion detector signal and provides an output that is representative of leak rate.

As best shown in FIG. 4, ion source 120 includes filaments 170 and 172, an extractor electrode 174, a reference electrode 176 and a repeller electrode 180, all located within vacuum housing 140. Ion source 120 further includes a source magnet 190 located outside vacuum housing 140. Source magnet 190 includes spaced-apart polepieces 192 and 194 located on opposite sides of vacuum chamber 142. It will be understood that the magnetic field provided by the source magnet can alternatively be provided by the fringe field extending from the main magnet 110.

Filaments 170 and 172 may each be in the form of a helical coil and may be supported by a filament holder 196. In one embodiment, each of filaments 170 and 172 is fabricated of 0.006 inch diameter iridium wire coated with thorium oxide.

Each filament coil may be 3 millimeters long and 0.25 millimeter in diameter. Preferably, one filament at a time is energized for extended ion source life.

Extractor electrode 174 may be provided with an elongated extractor slit 200, and reference electrode 176 may be provided with an elongated reference slit 202. Elongated slits 200 and 202, which serve as ion-optical lenses, are aligned and provide a path for extraction of ions from ion source 120 along ion trajectory 132. In FIG. 5, the inside surfaces of polepieces 112 and 114 of main magnet 110 are shown. As further shown, a long dimension of extractor slit 200 is perpendicular to the inside surfaces of polepieces 112 and 114. The length 204 of extractor slit 200 is sufficient that the width of the ion beam fills the gap 116 between polepieces 112 and 114, where the width of gap 116 is defined as the spacing in the vacuum chamber 142 between polepieces 112 and 114. The accelerating electric field between the extractor slit 200 and the reference slit 202 penetrates through the extractor slit and shapes the electric field in the cup-shaped recess 210 to provide efficient extraction and focusing of the helium ions formed just above the extractor slit. The extractor slit length may be relatively large in comparison with prior art mass spectrometers because the ion source is located outside of the main magnet. In one embodiment, the length 204 of extractor slit 200 is 8 millimeters, the width of extractor slit 200 is 3 millimeters, and gap 116 has a dimension of 10 millimeters. The dimensions of the reference slit 202 are also chosen to ensure that the beam width fills the gap. These configurations ensure a relatively high ion current of the desired trace gas species.

A potential source of signal loss is the divergence of the ion beam in the direction of the extractor slit length, due to the overall focusing/defocusing effect of the penetrating field near the ends of the extractor slit 200 and the reference slit 202. In some embodiments, because of the external ion source, the extractor slit length can be made equal to or greater than the width of gap 116. Then, the ions that are transmitted are those formed in the central portion of the extractor slit and these ions are transmitted more or less straight through to the detector. There is also some divergence due to the accelerating field penetrating through the reference slit, but this slit can also be made equal to or longer than the width of gap 116 so that the ions in the central portion are not substantially diverging. In order to increase the lengths of the extractor slit and/or the reference slit, it may be necessary or desirable to increase the overall size of the ion source.

As further shown in FIGS. 4 and 5, extractor electrode 174 is provided with chamfered edges 206 and 208 adjacent to filaments 170 and 172, respectively. Chamfered edges 266 and 208 shape the electric field in the vicinity of filaments 170 and 172 to enhance transport of electrons into the ionization region.

As shown in FIG. 4, reference electrode 176 is positioned between extractor electrode 174 and main magnet 110. Repeller electrode 180 is located above and is spaced from extractor electrode 174. Repeller electrode 180 includes a cup-shaped recess 210 that provides a desired electric field distribution. Alternatively, repeller electrode 180 may be held at the same electrical potential as extractor electrode 174 and may contact extractor electrode 174 or be fabricated together with extractor electrode 174 as a single unit.

Polepieces 192 and 194 of source magnet 190 may have generally parallel, spaced-apart surfaces facing vacuum chamber 142 and produce magnetic field 212 in a region of filaments 170 and 172, extractor electrode 174 and repeller electrode 180. As shown in FIG. 4, magnetic field 212 is deformed upwardly by the fringe magnetic field of main magnet 110. The resulting magnetic field distribution causes electrons emitted by filaments 170 and 172 to spiral around the direction of the magnetic field lines to an ionization region 220. Ionization region 220 is located above extractor slit 200 (FIG. 4). The electric fields and the magnetic fields in the region between filaments 170, 172 and ionization region 220 cause ionizing electrons to be accelerated toward ionization region 220. In ionization region 220, gas molecules are ionized by electrons from filaments 170, 172, are extracted from ion source 120 through extractor slit 200 and are accelerated through reference slit 202.

The ion source 120 is located outside of the main magnet 110, so that the length 204 of extractor slit 200 is not limited by polepieces 112 and 114 of main magnet 110. The dimensions of extractor slit 200 can be selected to transmit a high ion current. The beam optics yields a focal point after deflection through an angle of 135° following passage through the reference slit 202, as shown in FIG. 3. Mass spectrometer 100 includes main magnet 100 which separates the ions according to mass-to-charge ratio and source magnet 190 which includes polepieces 192 and 194 on opposite sides of filaments 170 and 172 in ion source 120. The two magnets are sufficiently close that they affect each other, both in strength and in field shape, as shown in FIG. 3. In one embodiment, main magnet 110 has a field strength of 1.7 K Gauss at the pole center and source magnet 190 has a field strength of 600 Gauss at the pole center.

The magnetic fields and the electric fields of the ion source 120 are designed so that the lines of magnetic flux are approximately coincident with and parallel to the surfaces of constant electrical potential (electrical equipotential surfaces), at least in ionization region 220. Because the ionizing electron beam generated by filaments 170 and 172 is constrained to follow the magnetic field lines, the ions are thus created in a volume of roughly constant electric potential. As a result, the ion beam has a very small energy spread and is very efficiently transported from the ion source 120 to the ion detector 130, thereby providing high sensitivity.

The positions of magnets 110 and 190 relative to ion source 120, ion detector 130 and each other are selected for efficient formation and transmission of ions. The main magnet 110 and the source magnet 190 are in close proximity to each other. A fringe field extending beyond the gap 116 of the main magnet 110 deforms the otherwise uniform magnetic field of the source magnet 190.

The lines of electrical equipotential surfaces are defined by the shape and spacing of the elements in the ion source 120, including the repeller electrode 180, the extractor electrode 174, the reference electrode 176 and the openings (slits) in these electrodes, and the adjacent vacuum chamber walls. The dimensions and spacings of these elements are controlled to form a "cup-open-down" electric field shape that focuses ions generated in the source toward the extractor slit 200 for more efficient extraction.

The relatively thick wall of repeller electrode 180 and extractor electrode 174 form a channel slightly wider than the filament diameter through which electrons can flow without loss, while electric field penetration from the negatively-charged filaments is limited. This limits leakage of ions from ionization region 220 to filaments 170 and 172 in the negative potential of the electron cloud, ensuring that a high percentage of ions created in the source are in fact transmitted from the source to the ion detector 130 for high sensitivity.

The ion source elements are designed such that the electric fields of the extractor electrode 174, the repeller electrode 180 and the reference electrode 176 produce electric fields that form a "virtual" ion optical object line rather than a physical entrance slit. The physical entrance slit and the unavoidable beam losses of the physical slit are eliminated so that ion beam transmission is very high. The slit in the reference electrode 176 acts only to limit the angular divergence of the ion beam, and not as an entrance slit and ion optical object.

Elimination of the physical entrance slit allows miniaturization of the mass spectrometer with minimal loss of either sensitivity or resolution. The resolving power of the mass spectrometer can be defined as the ratio of the ion beam radius, R, to the sum of the image width and the exit slit width, $S_{EX}$. For a conventional mass spectrometer design with a physical entrance slit of width $S_E$ forming the ion optical object of the system, the image width is $(S_E+R\alpha^2)$. The exit slit width is set to be equal to or slightly larger than the image width in order to transmit all the arriving ions, so that the resolving power, RP, is thus:

$$RP=R/2(S_E+R\alpha^2)$$

Because the ion optical object in the present invention is a line of negligible width, rather than a slit illuminated by a broad ion beam, the image width at the ion focal point is $R\alpha^2$ rather than $(S_E+R\alpha^2)$. Thus, the resolving power is:

$$RP=R/(2R\alpha^2)=1/(2\alpha^2)$$

Therefore, the resolving power is independent of the radius of the ion beam trajectory, so long as the width of the ion optical object can be ignored. With this design, if it is desired to reduce the ion beam radius R in order to achieve a compact device, the resolving power remains constant, so long as the ion beam divergence, $\alpha$, remains constant. The image width is reduced proportionately to the ion beam radius, and the exit slit width can be reduced by a comparable amount to match image width and maintain a constant mass-resolving power while transmitting all the ions exiting the ion source. By contrast, in a conventional mass-spectrometer, to maintain constant mass-resolving power while reducing the radius, the entrance slit width must be reduced proportionately, thereby reducing the fraction of ions transmitted through the slit and reducing the sensitivity of the device.

Voltages are applied to filaments 170 and 172, repeller electrode 180, extractor electrode 174 and reference electrode 176 to provide electric fields for operation as described above. In one embodiment where helium is the tracer gas, repeller electrode 180 is biased at 200 to 280 volts, extractor electrode 174 is biased at 200 to 280 volts and reference electrode 176 is grounded (0 volts). In addition, filaments 170 and 172 are biased at 100 to 210 volts to provide energetic electrons for ionization of the trace gas. In one specific example, repeller electrode 180 and extractor electrode 174 are nominally biased at 250 volts, filaments 170 and 172 are nominally biased at 160 volts and reference electrode 176 is grounded. The above voltages are specified with respect to ground. It will be understood that these values are given by way of example only and are not limiting as to the scope of the invention.

As shown in FIG. 3, ion optical lens 138 may include electrodes 250, 252 and 254, each having an aperture 256 to permit passage of ions to ion detector 130. Electrodes 250, 252 and 254 constitute an Einzel lens that focuses ions toward ion detector 130 and the electrical potential applied to electrode 252 acts to suppress ions of species other than helium that are scattered into trajectories that could otherwise allow them to reach the detector. In one embodiment, electrodes 250, 252 and 254 are biased at 0 volts, 180 volts and 0 volts, respectively.

In one embodiment, a detector assembly, including ion detector 130 and detector electronics 150, can be designed for high sensitivity measurement of ion currents over a wide range and with high signal-to-noise ratio. The ion detector 130 may be a Faraday plate that is connected to the inverting input of an electrometer grade operational amplifier. Ions that follow ion trajectory 132 through lens 138 strike the Faraday plate and generate a very small current in the plate. The amplifier is configured as an inverting transconductance amplifier with a bandwidth-limiting capacitor. The feedback resistor can be in a range selected to provide a gain of between $1 \times 10^9$ and $1 \times 10^{13}$. The capacitor is selected to allow the specified transient response of the detector, but to reject noise with a frequency higher than the desired transient response. To further reduce the 1/f noise, the amplifier is cooled by a Peltier or Thermo-Electric cooler. The cooler is a two-stage type with a maximum delta-T of 94 degrees C. The cold side of the cooler is bonded to the electrometer amplifier and the hot side is bonded to a detector structural post. The very low temperature of the electrometer amplifier in this thermal configuration lowers the input bias and offset currents and thus the 1/f noise components to their lowest achievable levels for this device when the spectrometer body is at its highest operating temperature. This guarantees the lowest possible noise from the detector under the worst-case ambient thermal conditions.

Figure 6:
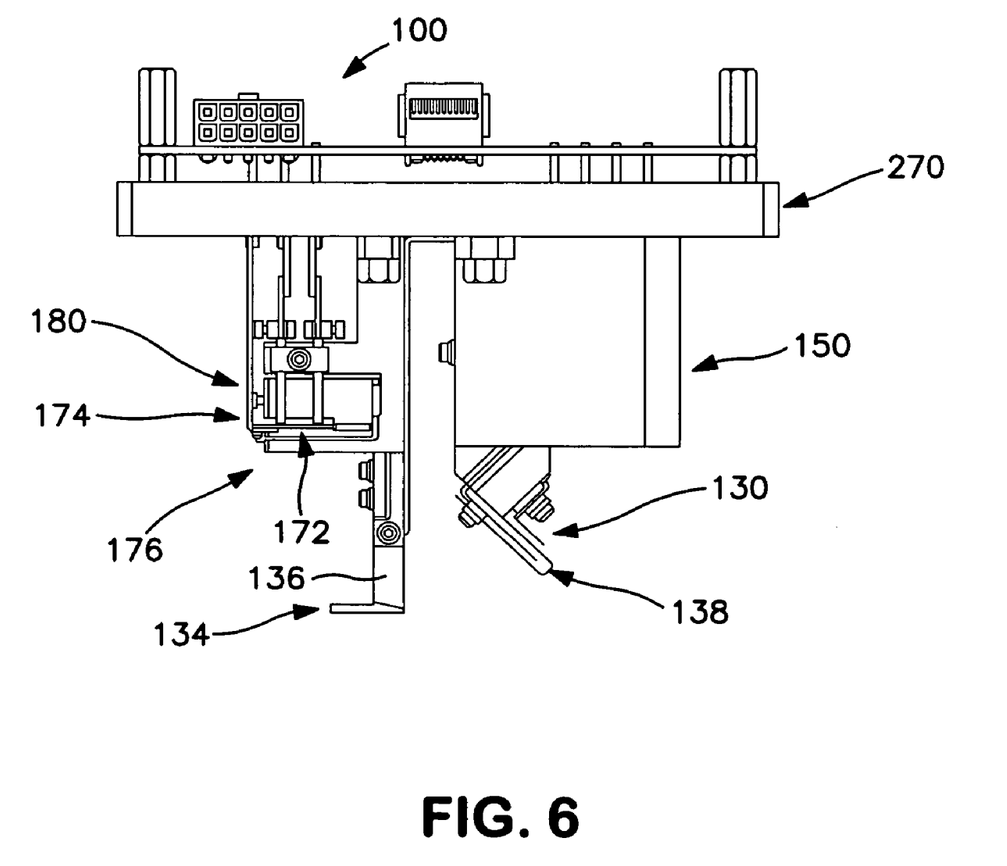
FIG. 6 illustrates an implementation of a mass spectrometer in accordance with an embodiment of the invention.

An example of an implementation of mass spectrometer 100 is shown in FIG. 6. Ion source components, including filaments 170 (not shown in FIG. 6) and 172, extractor electrode 174, reference electrode 176 and repeller electrode 180, collimator 134, ion detector 130, ion optical lens 138 and detector electronics 150 are supported by a header flange 270.

Various values of parameters, including but not limited to pressure levels, materials, dimensions, voltages and field strengths, are given above in describing embodiments of the invention. It will be understood that these values are given by way of example only and are not limiting as to the scope of the invention.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A mass spectrometer comprising:

a main magnet including spaced-apart polepieces which define a gap, the main magnet producing a main magnetic field in the gap;

an ion source to generate ions and to accelerate the ions into the main magnetic field in the gap, the ion source located outside the gap, wherein the ion source comprises:

an extractor electrode that defines an elongated extractor slit;

a reference electrode that defines an elongated reference slit;

at least one filament positioned adjacent to the extractor slit to generate ionizing electrons;

a repeller electrode spaced from the extractor electrode, wherein the ionizing electrons generated by the filament are accelerated from the filament to an ionization region near the extractor slit for ionization of a gas, and ions generated in the ionization region are extracted through the extractor slit and are accelerated through the reference slit into the gap between the polepieces of the main magnat; and a source magnet including spaced-apart polepieces that produce a source magnetic field to constrain trajectories of the ionizing electrons; and an ion detector to detect a selected species of the ions generated by the ion source and deflected by the main magnetic field, the ion detector located in the gap at a natural focus point of the selected species of the ions, wherein the dimensions and spacings of the extractor electrode, the reference electrode and the repeller electrode are configured to form a electric field that focuses ions generated in the ion source toward the extractor slit so that the main magnet deflects the ions of the selected species to the ion detector without use of a physical entrance slit.

2. The mass spectrometer as defined in claim 1, wherein the polepieces have surfaces facing the gap and wherein the ion source includes an elongated entrance slit having a long dimension perpendicular to the surfaces of the polepieces.

3. The mass spectrometer as defined in claim 2, wherein the gap has a width between the polepieces and wherein a length of the entrance slit is sufficient that the ions fill the width of the gap.

4. The mass spectrometer as defined in claim 2, wherein the gap has a width between the polepieces and wherein a length of the entrance slit is equal to or greater than the width of the gap.

5. The mass spectrometer as defined in claim 1, where the main magnet is configured to produce a substantially uniform magnetic field at least in a region traversed by ions between the ion source and the ion detector.

6. The mass spectrometer as defined in claim 1, further comprising a collimator positioned between the polepieces of the main magnet to block ions outside a trajectory between the ion source and the ion detector, and an ion optical lens positioned between the polepieces of the main magnet.

7. The mass spectrometer as defined in claim 1, further comprising a vacuum vessel defining a vacuum chamber between the polepieces of the main magnet and the polepieces of the source magnet, and a vacuum pumping system to vacuum pump the vacuum chamber.

8. The mass spectrometer as defined in claim 1, wherein the source magnetic field in the region between the polepieces of the source magnet is deformed by the main magnetic field of the main magnet.

9. The mass spectrometer as defined in claim 1, wherein the main magnet and the source magnet produce a magnetic field in the ion source wherein the extractor electrode and the repeller electrode produce an electric field having equipotential surfaces and wherein the magnetic field and the equipotential surfaces are approximately parallel in the ionization region.

10. The mass spectrometer comprises:
a main magnet including spaced-apart polepieces which define a gap, the main magnet producing a main magnetic field in the gap;
an ion source to generate ions and to accelerate the ions into the main magnetic field in the gap, the ion source located outside the gap, wherein theion source comprises:
an extractor electrode that defines an elongated extractor slit;
a reference electrode that defines and elongated reference slit;
at least one filament positioned adjacent to the extractor slit to generate ionizing electrons;
a repeller electrode spaced from the extractor electrode, wherein the ionizing electrons generated by the filament are accelerated from the filament to an ionization region near the extractor slit for ionization of a gas, and ions generated in the ionization region are extracted through the extractor slit and are accelerated throught the reference slit into the gap between the polepieces of the main magnet; and
a cource magnet including spaced-apart polepieces that produce a source magnetic field to constrain trajectories of the ionizing electrons; and
an ion dector to detect a selected species of the ions generated by the ion source and deflected by the main magnetic field, the ion detector located in the gap at a natural focus point of the selected species of the ions, wherein the at least one filament comprises first and second filaments positioned adjacent to opposite ends of the extractor slit.

11. The mass spectrometer as defined in claim 1, wherein the extractor electrode, the reference electrode and the repeller electrode are shaped to produce an electric field that focuses ions generated in the ionization region to a line focus that is subsequently imaged by focusing action of the main magnetic field.

12. The mass spectrometer as defined in claim 1, wherein an ion extraction zone is created in the ionization region by penetration of an accelerating electric field between the extractor electrode and the reference electrode.

13. The mass spectrometer as defined in claim 1, wherein the extractor electrode is chamfered in a region adjacent to the filament.

14. The mass spectrometer as defined in claim 1, wherein the repeller electrode is provided with a cup-shaped recess that produces an electric field which aids in focusing ions generated in the ionization region.

15. An ion source comprising:
an extractor electrode that defines an elongated extractor slit;
a reference electrode that defines an elongated reference slit;
first and second filaments positioned adjacent to opposite ends of the extractor slit to generate ionizing electrons;
a source magnet including spaced-apart polepieces that produce a magnetic field to constrain trajectories of the ionizing electrons; and
a repeller electrode spaced from the extractor electrode, wherein electrons generated by the filaments are accelerated to an ionization region near the extraction slit for ionization of a gas, and ions generated in the ionization region are extracted through the extractor slit and are accelerated through the reference slit wherein the dimensions and spacings of the extractor electrode, the reference electrode and the repeller electrode are configured to form an electric field that focuses ions generated in the ion source toward the extractor slit.

16. The ion source as defined in claim 15, wherein the repeller electrode is provided with a cup-shaped recess that produces an electric field which aids in focusing ions generated in the ionization region.

* * * * *

UNITED STATES PATENT AND TRADEMARK OFFICE
CERTIFICATE OF CORRECTION

PATENT NO. : 7,427,751 B2  Page 1 of 1
APPLICATION NO. : 11/354737
DATED : September 23, 2008
INVENTOR(S) : J. Daniel Geist It is certified that error appears in the above-identified patent and that said Letters Patent is hereby corrected as shown below:

Column 8, claim 1, line 67 should read:
"magnet; and"

Column 9, claim 1, line 10 should read:
"trode are configured to form an electric field that focuses"

Column 9, claim 10, line 52 should read:
"A mass spectrometer comprising:"

Column 9, claim 10, line 61 should read:
"a reference electrode that defines an elongated reference"

Column 10, claim 10, line 11 should read:
"a source magnet including spaced-apart polepieces that"

Column 10, claim 10, line 14 should read:
"an ion detector to detect a selected species of the ions gen-"

Column 10, claim 11, line 21 should read:
"The mass spectrometer as defined in claim 10, wherein"

Column 10, claim 12, line 27 should read:
"The mass spectrometer as defined in claim 10, wherein"

Column 10, claim 13, line 31 should read:
"The mass spectrometer as defined in claim 10, wherein"

Column 10, claim 14, line 34 should read:
"The mass spectrometer as defined in claim 10, wherein"

Signed and Sealed this

Thirteenth Day of April, 2010

David J. Kappos
*Director of the United States Patent and Trademark Office*